United States Patent [19]

Mazura et al.

[11] Patent Number: 5,675,475
[45] Date of Patent: Oct. 7, 1997

[54] DEVICE FOR INSERTING AND WITHDRAWING CIRCUIT BOARDS

[75] Inventors: Paul Mazura, Karlsbad; Michael Joist, Gaggenau; Hans-Ulrich Günther, Pfinztal; Hans-Martin Schwenk, Straubenhardt, all of Germany

[73] Assignee: Schroff GmbH, Straubenhardt, Germany

[21] Appl. No.: 611,538

[22] Filed: Mar. 7, 1996

[30] Foreign Application Priority Data

Mar. 7, 1995 [DE] Germany ............. 195 07 712.1

[51] Int. Cl.⁶ .................................................. H05K 7/14
[52] U.S. Cl. .................. 361/798; 361/754; 361/802; 361/796; 361/801; 439/327; 439/157
[58] Field of Search ............................. 361/732, 740, 361/741, 742, 747, 754, 759, 758, 796, 801–803, 798, 781; 211/41; 200/292; 439/327, 328, 152–159

[56] References Cited

U.S. PATENT DOCUMENTS 4,071,722  1/1978  Hart .
4,119,818  10/1978  Noschese .
4,835,737  5/1989  Herrig et al. .

FOREIGN PATENT DOCUMENTS

| 1037-240 | 8/1978 | Canada ............................... 361/798 |
| 0534674 | 3/1993 | European Pat. Off. . |
| 31 47 056 | 6/1983 | Germany . |
| 86 07 046 | 3/1986 | Germany . |
| 3636-088 | 11/1987 | Germany ............................ 361/754 |
| 41 05 948 | 8/1992 | Germany . |
| 2-110997 | 4/1990 | Japan ................................ 361/798 |

*Primary Examiner*—Leo P. Picard
*Assistant Examiner*—Anthony Dinkins
*Attorney, Agent, or Firm*—Spencer & Frank

[57] ABSTRACT

An insertion and withdrawal device for a plug-in assembly, provided for insertion into a sub-rack. A plunger is disposed in a holding bracket of the device for the purpose of actuating a microswitch. A space, that permits a switching process of the microswitch prior to separation of the plug connector, is provided between a press-down shoulder of the pivoting lever and the front surface of a profiled rail.

13 Claims, 1 Drawing Sheet

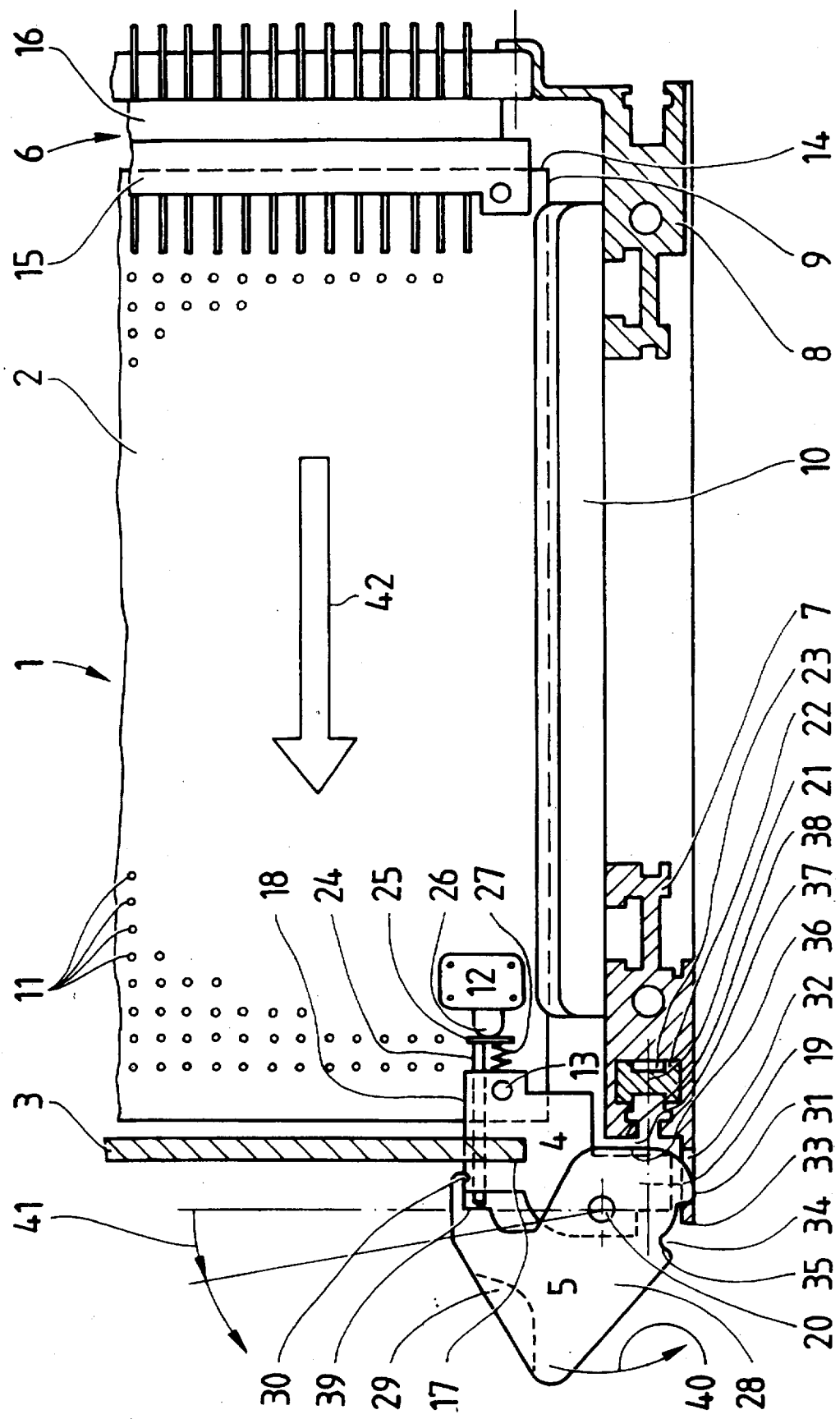

DEVICE FOR INSERTING AND WITHDRAWING CIRCUIT BOARDS

CROSS-REFERENCE TO RELATED APPLICATION

This application claims the priority of Application No. 195 07 724.5 filed in Germany on Mar. 7, 1995. The subject matter of that application is incorporated herein by reference.

BACKGROUND OF THE INVENTION

The invention relates to a device for inserting and withdrawing a plug-in assembly provided for insertion into a sub-rack, the device having a holding bracket for detachably securing a front plate, together with a printed circuit board, to a profiled rail of the sub-rack, the device further having a pivoting lever which is hinged to the holding bracket and has a press-down shoulder that is located in front of a front surface of the profiled rail when the plug-in assembly is inserted.

The invention is used, in particular with plug-in assemblys that are connected using plug connectors. The invention is also used with support circuits and components whose function does not permit uncontrolled disconnection from their current supply. Further, the invention is used with other electrical and electronic components likewise accommodated in the sub-rack, without damage occurring or data being lost.

A device is already known (DE 86 07 046 U1) for inserting and withdrawing plug-in assemblys. This device has a holding bracket which connects the printed circuit board and the front plate, and to which a pivoting lever is hinged. Because the components on the printed circuit board are uncontrollably disconnected from their current supply, damage can occur and/or stored data can be lost.

It is known to transfer a printed circuit board of an assembly unit, (with the board being provided with logical memory components) into a known switching state using a reset switch prior to withdrawal. A locking element which prevents withdrawal at a specific switch setting (DE 31 47 056 A1) can be operated with the switch. The contents of the memory are secured by the operation of the reset switch. The space requirement for the device behind the front plate is substantial.

Moreover, a device is known for inserting and withdrawing assembly units with the use of a lever that cooperates with the receptacle. This lever operates a switching device inserted into the front plate of the assembly and accessible from the. front (DE 41 05 948 A1).

SUMMARY OF THE INVENTION

It is the object of the invention to configure a plug-in assembly such that, prior to its withdrawal from the sub-rack, an electrical signal is generated which initiates a predetermined switching process.

To accomplish the object, a plunger, which is longitudinally displaceable due to the effect of the pivoting lever, is guided in the holding bracket in order to operate a switching element disposed on the printed circuit board. The pivoting lever first displaces the plunger and then withdraws the plug-in assembly.

The insertion and withdrawal device having a plunger is conceptualized such that only the plunger is displaced when the pivoting lever begins to pivot, but no withdrawal motion of the plug-in assembly itself is effected at this time. The displacement of the plunger, which is slight per se, is sufficient to operate a microswitch that effects a shutoff procedure In a preferred embodiment of the invention, a space is provided between the press-down shoulder and the front surface of the profiled rail when the plug-in assembly is inserted. As soon as the press-down shoulder has come into operational connection with the front surface (due to contact after the first pivoting motion), the displacement of the plug-in assembly, and thus the separation of the connector strip from the blade-contact connector, begins with further pivoting of the pivoting lever. Once the pivoting lever has reached its end position, the withdrawal process is ended and the plug-in assembly can easily be removed from the sub-rack. The plunger thus provides a switching stroke that permits purposeful shutoff of the switching elements on the printed circuit board.

In another embodiment of the invention, the pivoting lever comprises two partial levers which can be pivoted toward one another. The outer partial lever has a shoulder located opposite the plunger, and the inner partial lever supports supporting the press-down shoulder. A spring is disposed between the two levers. The slight displaceability of the two partial levers toward one another is limited by stops. The spring—for example, a compression spring—holds the two partial levers in their stopped positions. During withdrawal of the plug-in assembly, first the outer partial lever is pivoted toward the inner partial lever, counter to the compression spring, until it is stopped. This outer partial lever permits the displacement of the plunger. As the outer partial lever continues to pivot, the inner partial lever is carried along, and its press-down shoulder then effects the withdrawal.

BRIEF DESCRIPTION OF THE DRAWING

The invention is described in detail below with respect to its preferred embodiment, in conjunction with the attached drawing. The drawing shows, in a vertical sectional view through a sub-rack, and in a somewhat simplified representation, the lower part of an inserted plug-in assembly.

DETAILED DESCRIPTION OF THE INVENTION

The illustrated plug-in assembly 1 essentially comprises a printed circuit board 2, a front plate 3, a holding bracket 4, a pivoting lever 5 and a plug connector 6. This plug-in assembly 1 is inserted into a commercially-available sub-rack, of which only the front, lower profiled rail 7 and the rear, lower profiled rail 8 can be seen in cross-section. The lower longitudinal edge 9 of the printed circuit board 2 is seated in a guide rail 10 which is inserted between the two profiled rails 7 and 8 and is attached to them in a manner which is not shown.

The printed circuit board 2, shown broken off, comprises an insulating material and has a grid of holes 11 for securing electrical and electronic components connected to each other by electrical conductor paths. One of these components is a microswitch 12. In the region of its front, lower corner, the printed circuit board 2 is screwed to the holding bracket 4 by means of a cap screw 13. At its rear transverse edge, the printed circuit board 2 supports the connector strip 15 of the commercially-available plug connector 6, whose blade-contact connector 16 is attached to the rear, lower profiled rail 8. With the aid of this plug connector 6, the printed circuit board 2 is connected to the other electrical and electronic components, respectively, as well as to the current supply of the sub-rack.

The front plate 3, also shown broken off and in section, comprises a sheet of aluminum. It is an elongated-rectangular plate which is inserted by its lower, narrow side into a transverse slot 17 of the holding bracket 4 and secured there by means of spring elements.

The holding bracket 4 is diecast and has a backward-extending projection 18 that includes a threaded bore for the cap screw 13. The holding bracket 4 has a formed-on, front console 19 which is penetrated by a bearing hole in which a pivot pin 20 is seated.

The holding bracket 4 connects the front plate 3 with the printed circuit board 2 and permits the plug-in assembly 1 to be detachably secured to the front, lower profiled rail 7. This is effected with a long, threaded screw 21, which penetrates the holding bracket 4 (indicated by a dashed line) and extends into a threaded hole of a threaded strip 22 that has a double-T cross-section and is inserted into a longitudinal groove 23 of the profiled rail 7.

The holding bracket 4 has a longitudinally-displaceable plunger 24. This plunger 24 possesses the shape of a cylindrical pin, and penetrates the holding bracket 4 in a bore which is provided transversely to the front plate 3 and above the bore provided for the cap screw 13, and which guides the plunger, which can perform a back-and-forth movement. At its free rear end adjacent to the projection 18, the plunger supports a pressure plate 25, against which the actuating pin 26 of the microswitch 12 impacts. A spring element 27 in the form of a tension spring pulls the plunger 24 in the direction of the pivoting lever 5.

The pivoting lever 5 serves to insert the plug-in assembly 1 into the sub-rack and withdraw it therefrom. This pivoting lever 5 is hinged to the front console 19 of the holding bracket 4. Two parallel wall parts 28, located one on either side of the console 19, have holes for receiving the pivot pin 20 that penetrates the holding bracket 4. A finger depression 29, which facilitates the pressing down of the pivoting lever 5 during withdrawal of the plug-in assembly 1, is located on the top side of the pivoting lever 5. A catch 30 on the inside of the pivoting lever 5 extends into a detent on the top side of the holding bracket 4 and holds the pivoting lever 5 in its upwardly-pivoted position when the plug-in assembly is inserted.

A spur 31 extending into a slot 32 of a front-side, longitudinal strip 33 of the front profiled rail 7 projects from the pivoting lever 5, specifically from its two wall parts 28. A recess 34 provided next to the spur 31 forms a shoulder 35.

The pivoting lever 5 has a press-down shoulder 36 which is formed by the two wall parts 28. This press-down shoulder 36 is located opposite the front, lower profiled rail with a space 37 from the front surface 38. Moreover, the pivoting lever 5 utilizes a shoulder 39 opposite the front end of the plunger 24.

The drawing shows the plug-in assembly 1 in its inserted position in the sub-rack. The connector strip 15 rests against the blade-contact connector 16. The contacts are produced, and the printed circuit board 2 and its components are electrically connected to the sub-rack. The pivoting lever 5 is located in its upper position. Its catch 30 is latched. The shoulder 39 holds the plunger 24 in its backward position, counter to the force of the spring element 27 (the tension spring). The pressure plate 25 impacts against the pressed-in actuating pin 26 of the microswitch 12, and the electrical contact of the microswitch 12 is thereby closed. The press-down shoulder 36 is at a distance (i.e., space 37), which can be 1 to 2 mm, for example, from the front surface 38 of the front, lower profiled rail 7.

To withdraw the plug-in assembly 1, pressure is exerted on the pivoting lever 5 by a finger placed in the finger depression 29, whereupon the lever begins to pivot downwardly in the direction of arrow 40. First the catch 30 unlatches and the plunger 24 is displaced forward under the effect of the spring element 27. The plate 25 releases the actuating pin 26 of the microswitch 12. The electrical contact of the microswitch 12 opens, thereby triggering a signal which effects the shutoff of the electrical and electronic components, respectively, on the printed circuit board 2, or initiates data protection. As long as this is taking place, the plug-in assembly 1 is not withdrawn and the plug connection is retained. As before, the connector strip 15 remains plugged into the blade-contact connector 16. Because of the space 37 between the press-down shoulder 36 and the front surface 38 of the profiled rail 7, a pivoting of the pivoting lever by a small angle 41 of approximately 10 angular degrees is sufficient to open the contact of the microswitch 12.

Only when the pivoting lever 5 pivots further beyond the small angle 41 does the press-down shoulder 36 come to rest against the front surface 38 of the profiled rail 7, and the withdrawal process begins in the direction of the large arrow 42. In the process, first the plug of the connector strip 15 separates from the blades of the blade-contact connector 16 after a path of approximately 1 to 2 mm, thus interrupting the electrical connection between the plug-in assembly 1 and the other components of the sub-rack.

For complete withdrawal by means of further pivoting of the pivoting lever 5, the shoulder 35 of the lever 5 is supported against the front edge of the longitudinal strip 33 of the front profiled rail 7, and the plug-in assembly 1 can be removed from the sub-rack.

For insertion of the plug-in assembly 1, the pivoting lever 5 is located in its lowest position (in the direction of arrow 40) and the printed circuit board 2 is pushed into the guide rails 10. Toward the end of this displacement, the plug and the blades of the plug connector 6 face one another and the spur 31 of the pivoting lever 5 is located above the slot 32 of the longitudinal strip 33. Now the pivoting lever 5 is pressed up in the opposite direction of arrow 40, and the frictional forces in the plug connector 6 which impede insertion are easily overcome with the aid of the spur 31 seated on the short lever arm and now extending into the slot 32, and contacting is effected. Shortly before the pivoting lever 5 reaches its upper pivoting position, its shoulder 39 moving toward the head of the plunger 24 presses against the microswitch 12, whose contact closes. Lastly, the catch 30 latches in the detent of the holding bracket 4 and holds the pivoting lever 5 in its upper pivoting position.

What is claimed:

1. A plug-in assembly that is insertable into and withdrawable from a sub-rack having a profiled rail, the plug-in assembly comprising:

a printed circuit board having a switching element attached thereto;

a holding bracket connected to said printed circuit board and having a plunger guided thereon, said plunger being longitudinally displaceable toward and away from said switching element to engage and operate said switching element; and a pivoting lever hinged to said holding bracket and having a press-down shoulder that is engageable with the profiled rail, said pivoting lever being pivotable to a first position when said plug-in assembly is inserted into the sub-rack so that said pivoting lever engages with said plunger, and so that the press-down shoulder faces a front surface of the profiled rail, said pivoting lever further being pivotable to a second position when said plug-in assembly is removed;

whereby pivoting of said pivoting lever from said first position to said second position first causes a displacement of said plunger and operation of said switching element, and subsequently causes the press-down shoulder to engage with the front surface of the profiled rail to effect the withdrawal of the plug-in assembly from the sub-rack.

2. The plug-in assembly defined in claim 1, wherein a space is provided between the press-down shoulder and the front surface of the profiled rail when said pivoting lever is in the first position.

3. The plug-in assembly defined in claim 1, wherein said pivoting lever comprises two partial levers pivotable toward one another, one of said partial levers having a shoulder located opposite said plunger, and the other of said partial levers having the press-down shoulder formed thereon; further comprising a spring disposed between and interconnecting the two partial levers.

4. The plug-in assembly defined in claim 1, wherein said plunger is longitudinally displaceable in a direction essentially parallel to a longitudinal edge of said printed circuit board.

5. The plug-in assembly defined in claim 1, further comprising a pressure plate supported at an end of said plunger, said pressure plate being engageable with said switching element.

6. The plug-in assembly defined in claim 1, further comprising a spring acting upon said plunger.

7. The plug-in assembly defined in claim 6, further comprising a pressure plate supported at an end of said plunger, said pressure plate being engageable with said switching element; wherein said spring is a tension spring inserted between the pressure plate and said holding bracket.

8. The plug-in assembly defined in claim 1, further comprising a pressure plate supported at an end of said plunger, said pressure plate being engageable with said switching element; wherein said switching element comprises a microswitch positioned on said printed circuit board, said microswitch having an actuating pin located opposite said pressure plate.

9. The plug-in assembly defined in claim 1, wherein said holding bracket has a throughgoing bore formed therein, said plunger being guided in the throughgoing bore.

10. The plug-in assembly defined in claim 1, wherein said holding bracket has a groove formed thereon, said plunger being guided in the groove.

11. The plug-in assembly defined in claim 1, wherein said holding bracket has a detent formed thereon, and said pivoting lever has a catch that extends into the detent when said pivoting lever is in the first position.

12. The plug-in assembly defined in claim 1, further comprising a vertically extending front plate connected to said holding bracket and being located in a plane that is transverse to said printed circuit board.

13. The plug-in assembly defined in claim 12, wherein said holding bracket includes means for detachably securing said front plate and said printed circuit board to the profiled rail.

* * * * *